United States Patent
Kim et al.

(10) Patent No.: US 9,632,155 B2
(45) Date of Patent: Apr. 25, 2017

(54) APPARATUS AND METHOD FOR CONDUCTIVITY AND SUSCEPTIBILITY RECONSTRUCTION

(71) Applicant: Industry-Academic Cooperation Foundation, Yonsei University, Seoul (KR)

(72) Inventors: Dong-Hyun Kim, Seoul (KR); Narae Choi, Gyeonggi-Do (KR); Sung-Min Gho, Gyeongsangbuk-Do (KR); MinOh Ghim, Seoul (KR); Joonsung Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 995 days.

(21) Appl. No.: 13/886,990

(22) Filed: May 3, 2013

(65) Prior Publication Data
US 2014/0184219 A1      Jul. 3, 2014

(30) Foreign Application Priority Data

Dec. 28, 2012 (KR) .......................... 10-2012-0157394

(51) Int. Cl.
*G01R 33/48* (2006.01)
*G01R 33/44* (2006.01)
*G01R 33/561* (2006.01)
*G01R 33/565* (2006.01)

(52) U.S. Cl.
CPC ............ *G01R 33/48* (2013.01); *G01R 33/443* (2013.01); *G01R 33/5616* (2013.01); *G01R 33/56536* (2013.01)

(58) Field of Classification Search
CPC .. G01R 33/48; G01R 33/443; G01R 33/5616; G01R 33/56536
See application file for complete search history.

(56) References Cited

U.S. PATENT DOCUMENTS

| | | | |
|---|---|---|---|
| 4,720,679 A * | 1/1988 | Patrick ................... | G01R 33/24 324/309 |
| 6,658,280 B1 * | 12/2003 | Haacke .............. | A61B 5/02007 324/306 |
| 6,865,494 B2 * | 3/2005 | Duensing ............. | A61B 5/0507 324/439 |

(Continued)

*Primary Examiner* — Dixomara Vargas
(74) *Attorney, Agent, or Firm* — Mintz Levin Cohn Ferris Glovsky and Popeo, P.C.; Kongsik Kim; Jonathon Western

(57) ABSTRACT

An apparatus, a method, and a recorded medium for conductivity and susceptibility reconstruction are disclosed. The apparatus for conductivity and susceptibility reconstruction includes: a susceptibility reconstruction part configured to reconstruct a susceptibility from a change in phase according to an increase in time of a multi-echo gradient echo image; a zero echo phase estimation part configured to estimate a phase at zero echo time based on a linearity of the phase change; and a conductivity reconstruction part configured to reconstruct a conductivity from the estimated zero echo phase. According to an embodiment of the invention, a multi-echo gradient echo sequence is used to not only obtain in vivo susceptibility but also obtain conductivity simultaneously. Also, an embodiment of the invention can improve the accuracy of the susceptibility measurements.

12 Claims, 11 Drawing Sheets

(56) References Cited

U.S. PATENT DOCUMENTS

| | | | |
|---|---|---|---|
| 8,781,197 B2* | 7/2014 | Wang | G01R 33/54 |
| | | | 382/131 |
| 8,942,931 B2* | 1/2015 | Bulumulla | G01R 33/246 |
| | | | 324/309 |
| 9,165,386 B2* | 10/2015 | Sato | A61B 5/055 |
| 9,213,076 B2* | 12/2015 | Liu | G01R 33/56545 |
| 9,254,097 B2* | 2/2016 | Espy | A61B 5/05 |
| 9,268,003 B2* | 2/2016 | Griffin | G01R 33/288 |
| 2016/0007879 A1* | 1/2016 | Gonzalez | A61B 5/0537 |
| | | | 600/306 |

* cited by examiner

APPARATUS AND METHOD FOR CONDUCTIVITY AND SUSCEPTIBILITY RECONSTRUCTION

CROSS-REFERENCE TO RELATED APPLICATIONS

This application claims the benefit of Korean Patent Application No. 10-2012-0157394, filed with the Korean Intellectual Property Office on Dec. 28, 2012, the disclosure of which is incorporated herein by reference in its entirety.

TECHNICAL FIELD

Embodiments of the present invention relate to conductivity and susceptibility reconstruction, more particularly to an apparatus, a method, and a recorded medium for conductivity and susceptibility reconstruction which use a multi-echo gradient echo sequence to not only obtain in vivo susceptibility but also simultaneously obtain conductivity.

DESCRIPTION OF THE RELATED ART

MRI (Magnetic Resonance Imaging) is capable of producing in vivo images containing various forms of information, such as physical properties (T1, T2), tissue structure, motional properties (velocity, diffusion), temperature, and mechanical properties (stiffness, etc.).

It is also able to provide information regarding the electric and magnetic properties of tissue. The motivation to produce electric and magnetic property images has both clinical and research interests.

In terms of magnetic property imaging, the susceptibility of tissue has been a topic of wide research.

More specifically, susceptibility weighted images (SWI) have well defined clinical applications and thus have found routine clinical usage. Furthermore, the relative susceptibility value can be quantified using quantitative susceptibility mapping (QSM) approaches.

These quantitative approaches require advanced processing methods to accurately quantify the susceptibility.

While SWI and QSM have been widely investigated, the advancement of electric property imaging has been relatively slow.

Since the early 1990's when the original studies investigating the feasibility of electric property imaging have been demonstrated, several investigations have been pursued, and recently, due to the introduction of high-field MRI scanners and the need for SAR (specific absorption rate) monitoring, numerous studies regarding conductivity imaging have been reported.

The in-vivo determination of conductivity also has several potential clinical applications including tumor imaging and stroke. Given these circumstances, there is an ever-present motivation to improve techniques for electromagnetic (EM) property imaging.

Current techniques, however, have not been able to conduct a simultaneous acquisition of both conductivity and susceptibility measurement.

Generally, susceptibility acquisition is performed using a gradient echo, while conductivity acquisition is performed using a spin echo. Thus, the two properties were acquired using different procedures.

SUMMARY

An aspect of the invention, conceived to resolve the problem above, is to provide an apparatus, a method, and a recorded medium for conductivity and susceptibility reconstruction which use a multi-echo gradient echo sequence to not only obtain in vivo susceptibility but also obtain conductivity simultaneously.

To achieve the objective above, an embodiment of the invention provides an apparatus for conductivity and susceptibility reconstruction that includes: a susceptibility reconstruction part configured to reconstruct a susceptibility from a change in phase according to an increase in time of a multi-echo gradient echo image; a zero echo phase estimation part configured to estimate a phase at zero echo time based on a linearity of the phase change; and a conductivity reconstruction part configured to reconstruct a conductivity from the estimated zero echo phase.

The apparatus can further include a zero echo phase removal part configured to remove the estimated zero echo phase from the multi-echo gradient echo image, where the susceptibility reconstruction part can reconstruct the susceptibility by using the multi-echo gradient echo image with the zero echo phase removed.

The zero echo phase estimation part can estimate the zero echo phase by using a multi-echo gradient echo image obtained during an echo time corresponding to a T2* relaxation time.

The number of multi-echo gradient echo images obtained during the echo time corresponding to the T2* relaxation time can be at least two.

The multi-echo gradient echo image can be obtained from a 3-dimensional multi-echo gradient echo sequence.

The zero echo phase estimation part can estimate the zero echo phase according to the formula shown below:

$$\phi(x,y,z) = -\gamma \Delta B_0 t + \phi_0(x,y,z),$$

where $\phi(x, y, z)$ is a phase at voxel coordinates $(x, y, z)$, $\gamma$ is a gyromagnetic ratio, $\Delta B_0$ is an inhomogeneity of a main field, $t$ is time, and $\phi_0$ is a phase at zero echo time.

Another embodiment of the invention provides a method for conductivity and susceptibility reconstruction that includes: reconstructing a susceptibility from a change in phase according to an increase in time of a multi-echo gradient echo image; estimating a phase at zero echo time based on a linearity of the phase change; and reconstructing a conductivity from the estimated zero echo phase.

Still another embodiment of the invention provides a recorded medium readable by a digital processing device, tangibly embodying a program of instructions executable by the digital processing device to perform a method for conductivity and susceptibility reconstruction that includes: reconstructing a susceptibility from a change in phase according to an increase in time of a multi-echo gradient echo image; estimating a phase at zero echo time based on a linearity of the phase change; and reconstructing a conductivity from the estimated zero echo phase.

According to an embodiment of the invention, a multi-echo gradient echo sequence can be used to not only obtain the in vivo susceptibility but also the conductivity simultaneously.

Also, an embodiment of the invention can improve the accuracy of the susceptibility measurements.

Additional aspects and advantages of the present invention will be set forth in part in the description which follows, and in part will be obvious from the description, or may be learned by practice of the invention.

DETAILED DESCRIPTION

Figure 1:
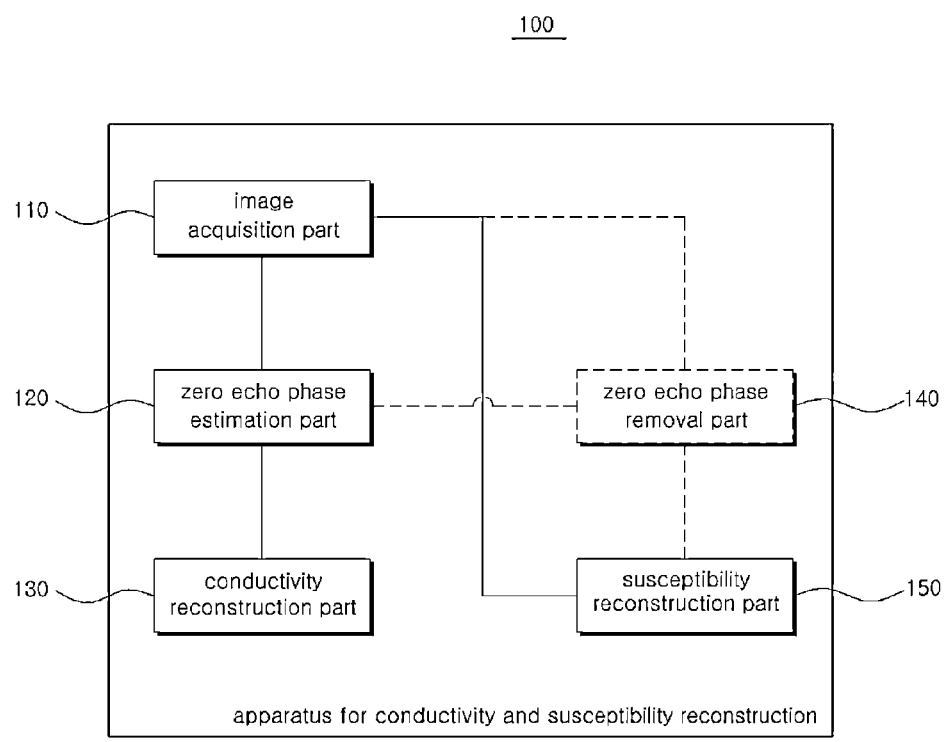
FIG. 1 illustrates the detailed composition of an apparatus for conductivity and susceptibility reconstruction according to an embodiment of the invention.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are used for like elements.

Certain embodiments of the invention will be described below in more detail with reference to the accompanying drawings.

FIG. 1 illustrates the detailed composition of an apparatus 100 for conductivity and susceptibility reconstruction according to an embodiment of the invention.

Figure 2:
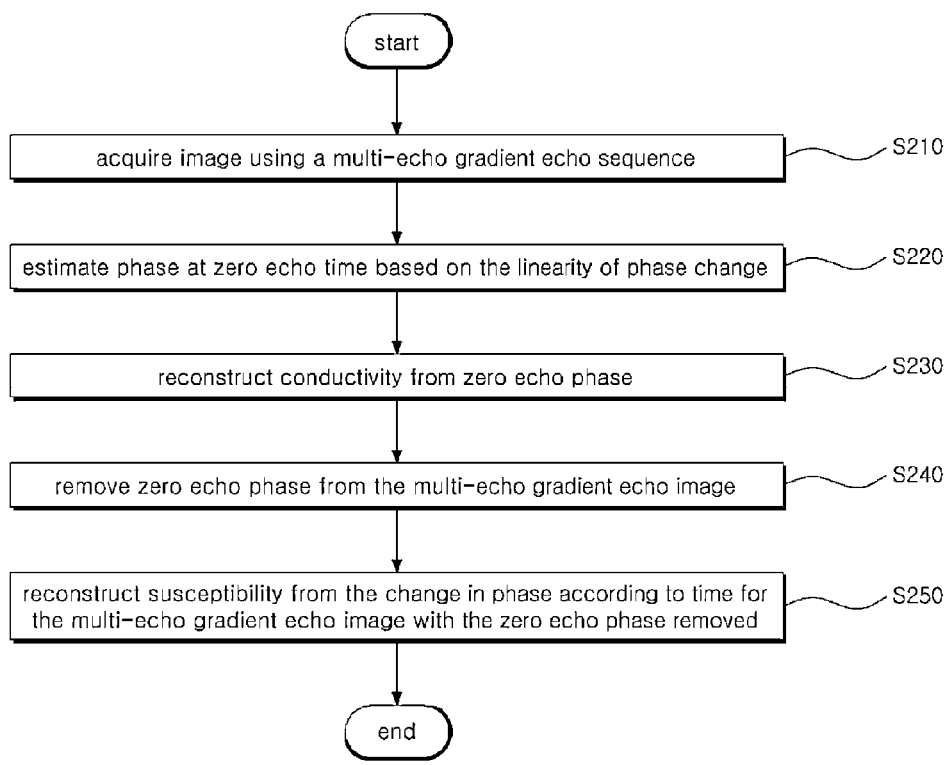
FIG. 2 is a flowchart illustrating a method of reconstructing conductivity and susceptibility according to time, based on an embodiment of the invention.

FIG. 2 is a flowchart illustrating a method of reconstructing conductivity and susceptibility according to time, based on an embodiment of the invention.

As illustrated in FIG. 1 and FIG. 2, an apparatus 100 for conductivity and susceptibility reconstruction can include an image acquisition part 110, a zero echo phase estimation part 120, a conductivity reconstruction part 130, a zero echo phase removal part 140, and a susceptibility reconstruction part 150; and a method for conductivity and susceptibility reconstruction can include acquiring an image (S210), estimating a zero echo phase (S220), reconstructing a conductivity (S230), removing the zero echo phase from the image (S240), and reconstructing a susceptibility (S250).

First, in step S210 in an embodiment of the invention, the image acquisition part 110 may acquire a multi-echo gradient echo image by using a 3-dimensional (3D) multi-echo gradient echo sequence.

For convenience, the descriptions that follow will be provided using an example in which it is assumed that the image acquisition part 110 uses a 3D multi-echo gradient echo sequence. However, the invention is not thus limited, and multi-dimensional multi-echo gradient echo sequences can also be utilized.

In step S220, the zero echo phase estimation part 120 may estimate the phase at zero echo time (TE=0) based on the linearity of the change in phase according to an increase in time of the multi-echo gradient echo image.

The phase can be for the change in spin phase according to an increase in time in a multi-echo gradient echo image.

Figure 3:
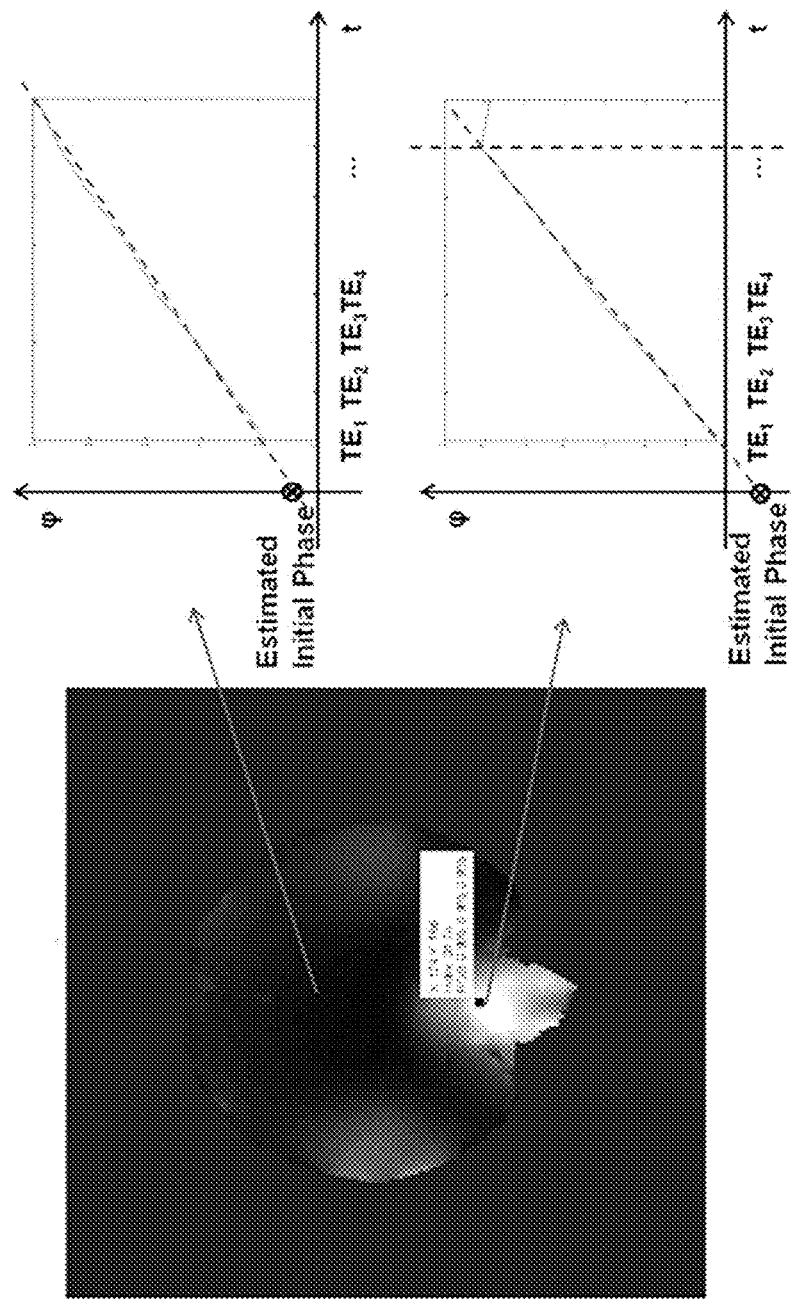
FIG. 3 illustrates the linear relationship in a change in phase according to an increase in echo time according to an embodiment of the FIG. 4 shows simulation results related to the lengths of readout times with respect to a multi-echo gradient echo sequence for accurate zero echo time phase estimation according to an embodiment of the invention.

FIG. 3 illustrates the linear relationship in a change in phase according to an increase in echo time according to an embodiment of the invention. From FIG. 3, it can be seen that there is a linear relationship for the phase change at a point along a multi-echo gradient echo.

Thus, the zero echo phase estimation part 120 can estimate a phase at zero echo time based on the linearity of the phase change.

In the second graph of FIG. 3, the abrupt decrease in signal, which does not follow the linear quality, can be explained by the fact that the loss in signals increases in later echoes in the case of tissue having a short T2 value.

According to an embodiment of the invention, the zero echo phase estimation part 120 can estimate the zero echo phase by the equations shown below.

$$\varphi(x, y, z) = -\gamma \Delta B_0 t + \varphi_0(x, y, z) \qquad \text{[Equation 1]}$$

$$mTE \begin{bmatrix} -\gamma \Delta B_0 \\ \varphi_0 \end{bmatrix} = \varphi,$$

$$\left( mTE = \begin{bmatrix} TE_1 & 1 \\ TE_2 & 1 \\ \vdots & \vdots \\ TE_n & 1 \end{bmatrix}, \varphi = \begin{bmatrix} \varphi_1 \\ \varphi_2 \\ \vdots \\ \varphi_n \end{bmatrix} \right)$$

$$\therefore \begin{bmatrix} -\gamma \Delta B_0 \\ \varphi_0 \end{bmatrix} = mTE^{-1} \varphi$$

Here, φ(x, y, z) is the phase at voxel coordinates (x, y, z), γ is the gyromagnetic ratio, $\Delta B_0$ is the inhomogeneity of the main field, t is time, and $\varphi_0$ is a phase at zero echo time.

As described above, when the zero echo phase estimation part 120 estimates the phase at zero echo time based on the linearity of the change in phase according to an increase in time, there can be a multiple number of optimal multi-echo gradient echo images.

Thus, the zero echo phase estimation part 120 according to an embodiment of the invention can estimate the zero echo phase by using multi-echo gradient echo images obtained during an echo time corresponding to the T2* relaxation time of the tissue.

This is in agreement with the fact that, when a linear relationship is established (in voxel units) from a phase signal up to the echo in which the size of the signal is reduced to 37% of the first echo, the accuracy of zero echo phase estimation is improved.

According to an embodiment of the invention, the number of multi-echo gradient echo images obtained during an echo time corresponding to the T2* relaxation time can be at least two.

Figure 4:
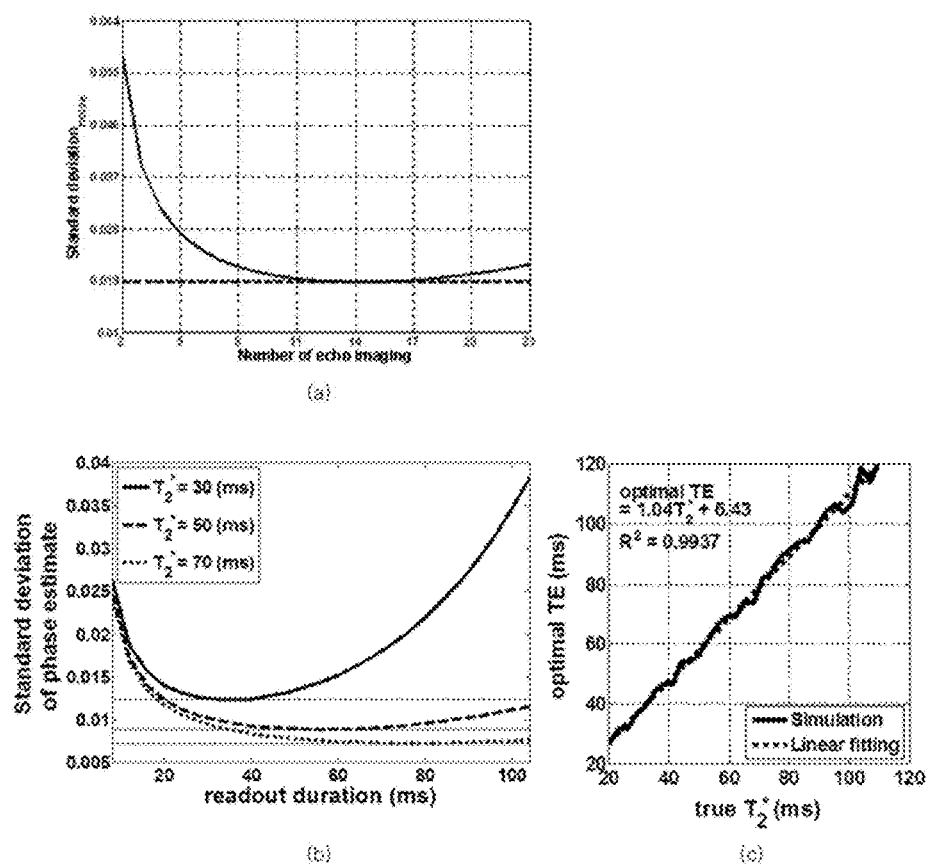

FIG. 4 shows simulation results related to the length of readout time with respect to a multi-echo gradient echo sequence for accurate zero echo time phase estimation according to an embodiment of the invention.

That is, FIG. 4 shows the number of echo sampling for estimating the optimal zero echo time phase, where graph (a) shows the standard deviation of the estimated initial phase (at TE=0) as a function of the number of echoes that are collected, graph (b) shows the standard deviations of the phase estimates as functions of readout duration, and graph (c) the last TE value collected for minimizing the standard deviation of phase estimate noise as a function of $T2^*$ variations.

In graphs (a) and (b) in FIG. 4, the standard deviation of a phase estimate is shown as a function of the number of echoes used, illustrating that there exists a certain number of echoes which provides the most robust phase estimate.

Graph (c) in FIG. 4 shows the minimum number of echoes in terms of the $T2^*$ value, from which it can be concluded that the number of echoes selected should roughly equal the $T2^*$ value for best phase estimate (at TE=0). That is, the multi-echo gradient echo sequence should obtain data up to the approximately the $T2^*$ value of the object.

This has significance in that conductivity quantification using phase value is very sensitive to noise.

These results are in agreement with other test results in which the signal of the phase increases with time but signal amplitude decreases as an exponential function with time constant $T2^*$. These results generally vary with the SNR of the data.

Continuing with the description of the method, in step S230, the conductivity reconstruction part 130 may reconstruct the conductivity from the zero echo phase estimated in step S220.

According to an embodiment of the invention, the phase signals of a multi-reception coil can be combined to be optimized for conductivity reconstruction, after which filtering can be performed to remove noise and image segmentation can be performed for different types of tissue.

The table below shows the results of conductivity measurements on samples that include particular concentrations of NaCl, for a method based on an embodiment of the invention in comparison to prior methods.

TABLE 1

|  | 0.12 (%) | 0.24 (%) | 0.36 (%) | 0.48 (%) | 0.60 (%) |
|---|---|---|---|---|---|
| Reference (conductivity meter) | 0.30 | 0.58 | 0.86 | 1.14 | 1.40 |
| SE | 0.7316 | 0.6409 | 0.8893 | 1.1446 | 1.3379 |
| Multi-echo | 0.7671 | 0.6077 | 0.9062 | 1.1707 | 1.36 |

Here, "Reference" represents the conductivity values measured using a conductivity meter, "SE" represents the conductivity values measured using spin echo, and "Multi-echo" represents the conductivity values measured according to an embodiment of the invention. The measurements, in units of S/m, were taken at a temperature of 24° C.

As shown in Table 1 above, the conductivity values estimated according to an embodiment of the invention are very similar to the results obtained using a separate spin echo measurement procedure according to prior art. Moreover, for NaCl concentrations of 0.24% and 0.60%, the conductivity values estimated according to an embodiment of the invention are better than the results obtained using spin echo.

Figure 5:
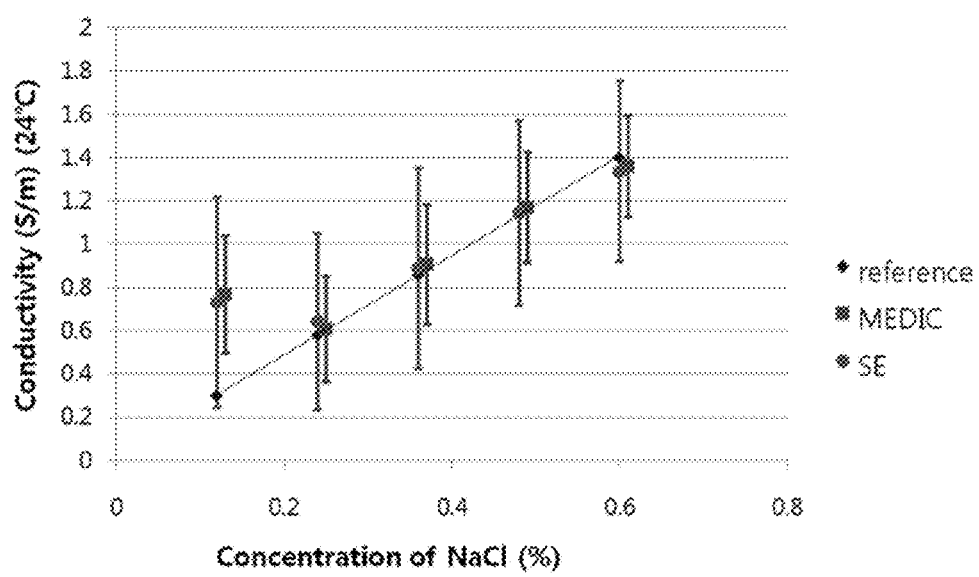
FIG. 5 is a graph showing the standard deviation values for conductivity measurement results according to an embodiment of the invention for a sample containing a particular concentration of NaCl, in comparison to values obtained by a conventional method.

FIG. 5 is a graph showing the standard deviation values for the conductivity measurement results of Table 1 in comparison to values obtained by a conventional method.

Referring to FIG. 5, the vertical bars show the deviations of the conductivity estimates for local homogeneous regions. It can be seen that the standard deviations of the conductivity values measured according to an embodiment of the invention are smaller than the standard deviations of the conductivity values measured using a separate SE procedure.

Next, in step S240, the zero echo phase removal part 140 may remove the zero echo phase estimated in step S220 from the multi-echo gradient echo image obtained in step S210.

This is because the multi-echo gradient echo phase includes the influences of both conductivity and susceptibility. By removing the zero echo phase estimated in step S220 from the multi-echo gradient echo image, the phase can include only the influence of susceptibility, and the accuracy of the susceptibility measurement can be improved.

In step S250, the susceptibility reconstruction part 150 may reconstruct the susceptibility by using the multi-echo gradient echo image with the zero echo phase removed.

According to an embodiment of the invention, the susceptibility reconstruction part 150 can remove the time axis noise of the multi-echo gradient echo image, perform phase unwrapping, remove the background phase, and afterwards reconstruct susceptibility images.

In the descriptions that follow, it will be assumed that the susceptibility reconstruction part 150 reconstructs susceptibility by using a multi-echo gradient echo image with the zero echo phase removed by the zero echo phase removal part 140, for improved accuracy in the susceptibility measurements. However, the present invention is not limited thus, and the susceptibility reconstruction part 150 can reconstruct susceptibility using the multi-echo gradient echo image before the zero echo phase is removed.

In general, susceptibility acquisition methods rely on a long echo time (TE) or a multi echo gradient-echo sequence.

The phase evolution during the echoes relates to the local susceptibility variations and can be used to determine the susceptibility.

Determining susceptibility can be performed using a direct voxel by voxel division method.

As described above, embodiments of the invention can obtain and image not only in vivo susceptibility but also conductivity by using a multi-echo gradient echo sequence for acquiring a magnetic resonance image, and furthermore can improve the accuracy of the susceptibility measurement.

A more detailed description is provided below, with reference to FIG. 6, of generating a conductivity image and a susceptibility image using susceptibility and conductivity obtained simultaneously according to an embodiment of the invention, including a look at how the accuracy of the susceptibility measurement can be improved.

Figure 6:
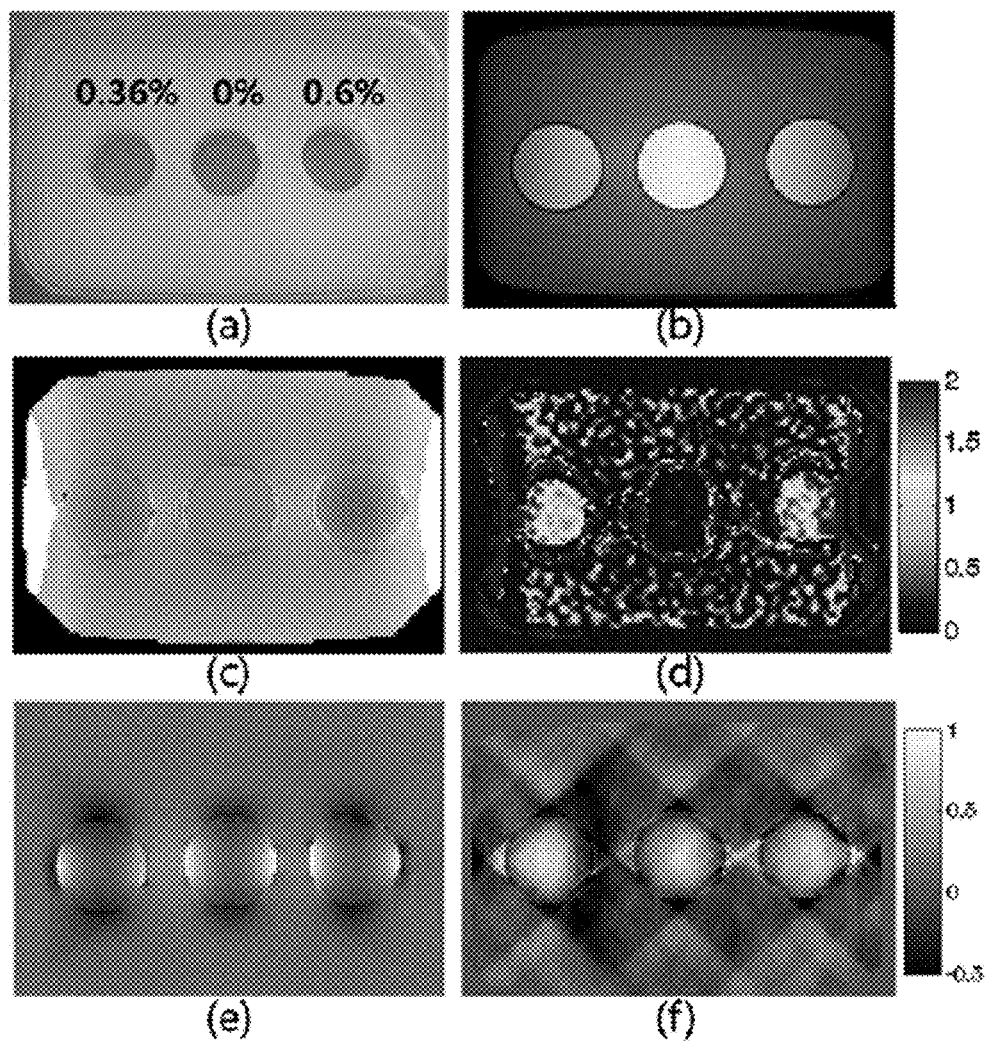
FIG. 6 shows simulation results for a method of conductivity and susceptibility reconstruction according to an embodiment of the invention.

FIG. 6 shows simulation results for a method of conductivity and susceptibility reconstruction according to an embodiment of the invention, where three cylinders containing a mixture of NaCl and Gd (gadolinium) were used.

More specifically, drawing (a) of FIG. 6 illustrates a phantom design of the cylinders with the same Gd concentration of 0.5% and the NaCl concentrations indicated on the drawing; drawing (b) illustrates a magnitude image; drawing (c) illustrates an interpolated phase image at zero echo time; drawing (d) illustrates a conductivity map; drawing (e) illustrates the estimated phase induced by the susceptibility component only; and drawing (f) illustrates a susceptibility map using the phase from drawing (e).

In drawing (d) of FIG. 6, a conductivity map is provided, in which the quantitative values obtained were 0.88±0.45 (left), 0.08±0.37 (center), 1.44±0.42 (right) S/m. Measurement values using a conductivity meter gave 0.86 (left), 0.02 (center), and 1.5 (right) S/m.

In drawing (f) of FIG. 6, the relative susceptibility values obtained were 0.64±0.15 (left), 0.62±0.06 (center), and 0.64±0.09 (right) ppm.

Thus, according to an embodiment of the invention, simultaneous EM property imaging is feasible. A multi-echo gradient echo sequence can be used to retrieve phase values at TE=0 which can be used to determine the conductivity. It can also be seen that the other phase values subsequently can be used to determine the susceptibility. In susceptibility processing, removal of phase values at zero echo time can provide more accurate results.

Conventional methods of measuring conductivity may generally require the use of spin echo and may require detailed information of the local $B_1$ magnitude and phase.

However, according to an embodiment of the invention as described above, it is possible to measure conductivity with only the phase distribution of $B_1$.

That is, according to an embodiment of the invention, this can be achieved by interpolating the phase at TE=0 using a multi-echo gradient echo acquisition.

A more detailed description is provided below, with reference to FIGS. 7 to 11, of applying the conductivity and susceptibility, obtained simultaneously by an apparatus 100 for conductivity and susceptibility reconstruction according to an embodiment of the invention, to electromagnetic property imaging.

Before describing the application to imaging, the underlying theory for conductivity and susceptibility reconstruction operations is described below.

In general, RF (radio frequency) pulses are used for spin excitation in MR (magnetic resonance). The distribution of the RF within the object is governed by Maxwell's equation.

Here, the admittivity distribution modulates both the magnitude and phase of the RF field. From time harmonic Maxwell's equations, the RF field can be expressed by the equation shown below.

$$\nabla \times E(r) = -i\omega\mu_0 H(r), \nabla \times H(r) = \tau(r)E(r) \quad \text{[Equation 2]}$$

Here, $\mu_0$ represents the permeability of free space, $\tau$ represents and admittivity ($\tau = \sigma + i\omega\epsilon$), $\sigma$ represents conductivity, $\omega$ represents frequency, and $\epsilon$ represents permittivity. It is assumed that $\mu = \mu_0$ for in vivo. E and H represent the time-harmonic electric and magnetic fields, respectively, over a position defined by r.

By taking the curl operation to Equation 2 and using vector identities, the above Equation 2 can be expressed as the equation shown below.

$$-\nabla^2 H(r) = \frac{\nabla \tau(r)}{\tau(r)} \times [\nabla \times H(r)] - i\omega\mu_0 \tau(r) H(r) \quad \text{[Equation 3]}$$

Equation 3 above can be used to formulate the distribution of the RF field H over an object with admittivity $\tau$.

The distribution of the magnetization H due to the RF field at zero echo time is determined by the above Maxwell's equation.

Here, not only the magnitude but also the phase of RF field H is also modulated.

This time harmonic H field can be divided into a positive and negative rotating component by the equation shown below.

$$H(r) = H(r)^+ + H(r)^- \quad \text{[Equation 4]}$$

Proton magnetization reacts only to $H^+$, leading to (for small flip angles) the transverse magnetization $M(r)^+ \propto iM_0 H+$, where $M_0$ represents the initial longitudinal magnetization.

The received signal due to Fourier encoding and T2* effects can then be modeled as the equation shown below.

$$s(t) = H(r)^- \iint M(r,t)^+ e^{-i2\pi k_r \cdot r} e^{-t/T2^*} dr \quad \text{[Equation 5]}$$

The unavoidable component H– can be explained from the theory of reciprocity. $M(r, t)^+$ precesses with the local susceptibility variations according to the equation shown below.

$$\angle M^+(r, t) = \frac{1}{4\pi} \int \chi(r') \cdot \frac{3\cos^2\alpha - 1}{|r' - r|} dr' + \angle H(r, TE = 0)^+ \quad \text{[Equation 6]}$$

Therefore, noting that the phase evolution due to k space can be removed, the phase in s(t) is given by the equation below.

$$\angle s(t) \sim \angle H(r, TE=0)^+ + \angle H(r, TE=0)^- + \angle M^+(r, t>0) \quad \text{[Equation 7]}$$

No phase evolution occurs in the received signal due to $H^+$ and $H^-$ after t>0 since the RF channel is turned off. Also, phase due to $H^+$ and $H^-$ do not obey Laplace equations and cannot be removed by harmonic filtering approaches.

To summarize, $\angle s(t=0)$ provides information regarding $H^-$ and $H^+$, which is determined by the electrical properties. Phase evolution $\angle s(t>0)$ can be determined by the magnetic susceptibility properties with the phase at t=0 added as an offset.

To collect the phase evolution information and to be able to extrapolate the t=0 phase value, a multi-echo gradient echo sequence can be used.

Based on the underlying theory related to conductivity and susceptibility acquisition, a description is provided below of applying the simultaneously obtained conductivity and susceptibility to electromagnetic property imaging.

Generally, MRI (magnetic resonance imaging) can provide images weighted by the electromagnetic properties of the tissue as well as quantitative electromagnetic maps.

For susceptibility imaging, phase evolution may be used to produce quantitative susceptibility maps.

For conductivity imaging, the phase value at zero echo time may be retrieved, which generates quantitative conductivity maps.

First, simulations may be performed to investigate the amount of phase that is actually present at TE=0 due to conductivity distributions.

Here, cylindrical objects of various sizes (2, 5, 10 mm) and conductivity values (0.1~2.0 σ/m) can be assumed, and the phase differences within the objects can be noted.

The phase distributions can be calculated via a fast FDTD (finite difference time domain) algorithm using Bessel boundary conditions.

Next, to determine the TE=0 phase from the multi-echo gradient echo data set, at least two echoes can be collected.

Generally, the more echoes collected can give rise to accurate TE=0 phase estimation. However, T2* decay may decrease the SNR of the late echo data sets which can deteriorate the estimation.

Simulations may be performed to investigate the optimal number of echoes that are to be collected to determine the optimal echo length. An exponentially decaying signal model can be used with increasing noise added as a function of echo time.

After phase unwrapping, linear extrapolation may be performed, and the simulation can be repeated many times to determine the echo length with the minimum standard deviation of the extrapolated phase.

Images may be reconstructed using quantitative methods, i.e. quantitative susceptibility mapping (QSM) and quantitative conductivity mapping (QCM).

The QSM can be determined, for example, using a regularized l1 norm minimization method.

While algorithms for susceptibility measurements are relatively in common use, methods for QCM are still an active ongoing research.

To determine the applicability of in-vivo imaging, a 3D in-vivo brain model can be used to test both susceptibility and conductivity simulations.

Using an electromagnetic software, such as REMCOM, for example, a 128×128×128 brain model can be built with susceptibility and conductivity contrast, and phase values due to the electromagnetic distributions can be produced. Also, a 16 rung birdcage head coil can be assumed for the simulations.

According to an embodiment of the invention, the phase distribution at TE=0 can be determined by the EM simulator, while phase distribution afterwards can be implemented using a rapid approach under a given susceptibility distribution.

Afterwards, reconstruction may be performed to estimate QSM and QCM values using the methods described above.

Also, the effect on QSM due to TE=0 phase may be investigated by performing QSM with and without TE=0 phase removal.

By way of anon local filtered Laplacian approach using only the phase of the H field measurement, the conductivity maps can be generated using the equation shown below.

$$\sigma = \frac{\nabla^2 e^{i\angle f(H^+)}}{\mu \omega e^{i\angle f(H^+)}} \quad \text{[Equation 8]}$$

Here, f represents the filter.

All phantom and in-vivo data were acquired from a 3T scanner. For the phantom study, a mixture of Gd (0%, 0.5%, 1%) and NaCl (0%, 0.5%, 1%) were added to small vials.

The purpose of this is to demonstrate that QSM provides contrast depending on the Gd concentration while QCM gives contrast determined by the NaCl concentration.

Since QCM provides absolute quantification, a resistance meter can also be used to find the true conductivity value which gave 1.2 S/m and 2.4 S/m for the 0.5% and 1% NaCl phantom, respectively.

The imaging parameters were as follows: TR=250 ms, First TE=5.67 ms, Echo spacing=5.51 ms, Flip angle=30°, number of echoes=16, voxel size=1.5×1.5×2 $mm^3$.

An in-vivo volunteer brain was scanned using the multi-echo gradient echo sequence. The imaging parameters were as follows: TR=95 ms, First TE=5.67 ms, Echo spacing=5.51 ms, Flip angle=27°, number of echoes=16, FOV=256×256 $mm^2$, number of slices=128, voxel size=1× 1×1 $mm^3$.

Figure 7:
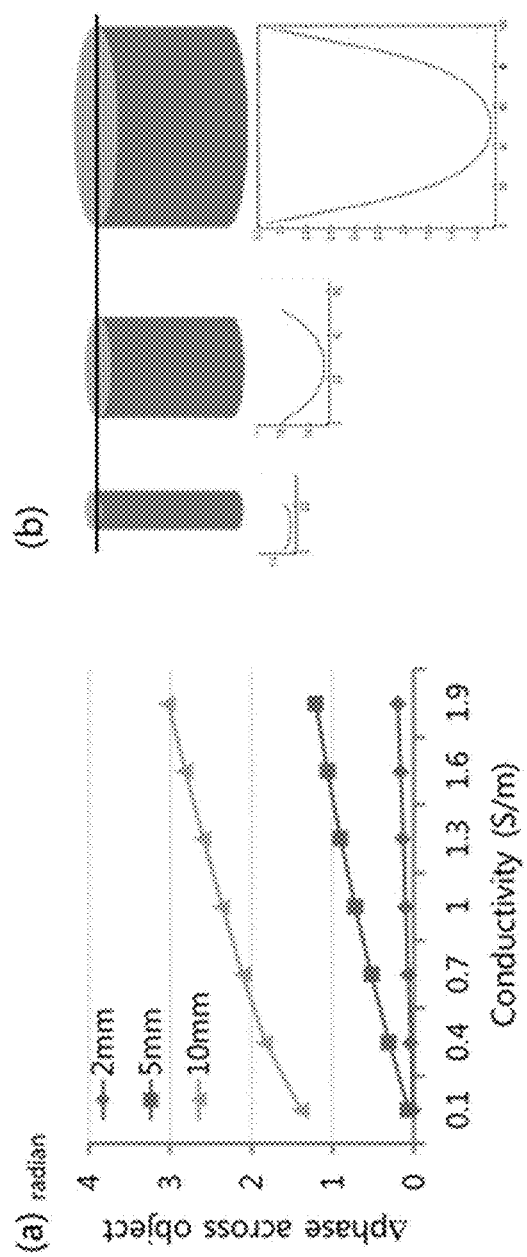
FIG. 7 illustrates phase distributions of objects at zero echo time for various conductivity values obtained according to an embodiment of the invention.

FIG. 7 illustrates phase distributions of objects at zero echo time for various conductivity values obtained according to an embodiment of the invention.

More specifically, FIG. 7 illustrates the influence of conductivity on zero echo time phase distribution, where drawing (a) is a graph showing simulated phase difference across objects of various sizes as a function of conductivity, and drawing (b) is a phase plot (at TE=0) for different sized objects (radius=2, 5, 10 mm) with the conductivity set to 0.7 S/m. All objects in the simulation were assumed to be of a cylindrical shape.

Referring to drawing (a) of FIG. 7, it can be seen that higher conductivity values generally produce more phase variations around the object which can hamper susceptibility mapping. That is, at TE=0, the phase can be different in objects having the same susceptibility.

However, in terms of conductivity mapping, this can be a positive effect since more robust conductivity estimates can be made.

The wave length (also related to the wave number) is dependent, according to electromagnetic theory, on the operating frequency and admittivity distribution.

As illustrated in drawing (b) of FIG. 7, the object size can limit the detectable phase distribution along the object.

Figure 8:
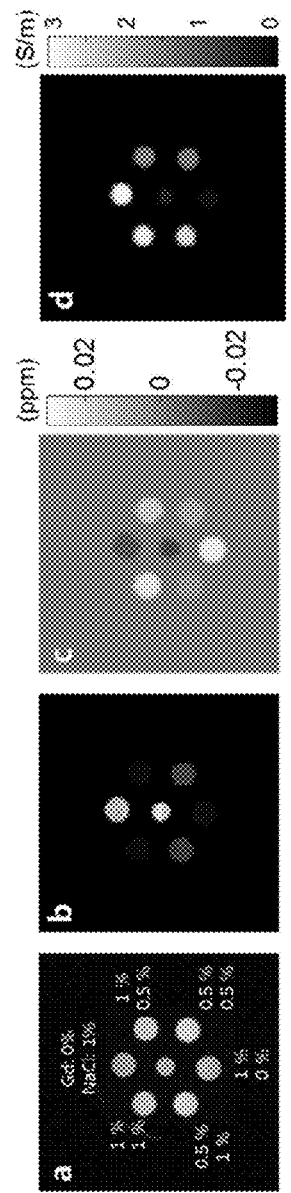
FIG. 8 shows phantom test results obtained when varying the amounts of conductivity and susceptibility according to an embodiment of the invention.

FIG. 8 shows phantom test results obtained according to an embodiment of the invention, where the amounts of conductivity and susceptibility are varied in the phantom images.

More specifically, drawing (a) of FIG. 8 is a phantom proton density (PD) image, drawing (b) is a susceptibility weighted image (SWI), drawing (c) is a QSM, and drawing (d) is a quantitative conductivity map (QCM) (NaCl conductivity of 0.5% gives 1.2 S/m).

Referring to FIG. 8, the images show QSM and QCM for a mixture of NaCl and Gd concentration, and the results indicate good agreement with the concentration of these property varying agents. That is, the images show contrast which is in good agreement depending on the amount of materials added.

It can be seen that QCM provides an absolute quantification value while QSM provides a relative quantification value. In addition, the conductivity value provided by QCM is at the operating frequency of 3T while QSM provides the susceptibility value at DC.

Figure 9:
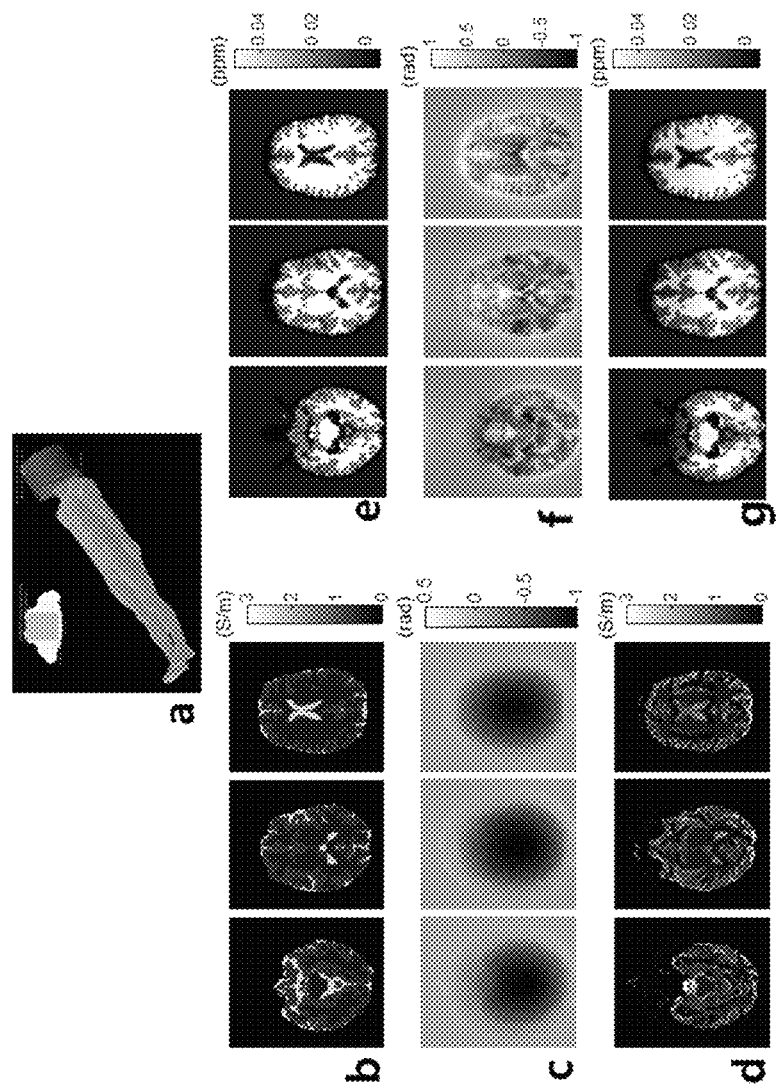
FIG. 9 shows simulation results for a brain-shaped model according to an embodiment of the invention.

FIG. 9 shows simulation results for a brain-shaped model according to an embodiment of the invention, with EM human simulation results illustrated.

More specifically, drawing (a) of FIG. 9 shows a layout of a REMCOM human simulation, drawing (b) shows the actual conductivity map used in the simulation, drawing (c) shows the simulated phase map at TE=0, drawing (d) shows the reconstructed conductivity map, drawing (e) shows the actual susceptibility map used in the simulation, drawing (f) shows the simulated phase map, and drawing (g) shows the reconstructed susceptibility map.

Referring to FIG. 9, the resulting simulation phase distribution is given in drawings (c) and (f), and the reconstruction of the quantitative conductivity and susceptibility maps are shown in drawings (d) and (g), respectively.

The reconstructed susceptibility maps are similar to the true values (drawing (e) of FIG. 9), while the reconstructed conductivity maps have slight differences compared to the true values (drawing (b) of FIG. 9). It can be seen, however, that the contrast is generally similar.

Additionally, QSM images could be reconstructed with and without the compensation due to TE=0 phase distribution, and the images did not show substantial differences (not shown).

An ROI based analysis of the differences in QCM and QSM from the true values are provided in Table 2 below.

TABLE 2

| region | Real σ (S/m), (Relative permittivity) | Estimated σ | Real χ (ppm) | Estimated χ (before TE = 0 correction) | Estimated χ (after TE = 0 correction) |
|---|---|---|---|---|---|
| CSF | 2.14 (84) | 1.1504 ± 0.4030 | 0 | −0.0030 ± 0.0067 | −0.0020 ± 0.0061 |
| GM | 0.6 (73) | 0.6210 ± 0.0458 | 0.02 | 0.0165 ± 0.0049 | 0.0169 ± 0.0049 |
| WM | 0.3 (52) | 0.3256 ± 0.0045 | 0.05 | 0.0438 ± 0.0049 | 0.0444 ± 0.0050 |
| Thalamus | 0.6 | x | −0.05 (arbitrary value) | −0.0446 ± 0.0019 | −0.0442 ± 0.0019 |
| Hypothalamus | 0.6 | x | 0.035 (arbitrary value) | 0.0262 ± 0.0017 | 0.0264 ± 0.0017 |
| Hippocampus | 0.6 | x | 0.005 (arbitrary value) | 0.0065 ± 0.0020 | −0.0060 ± 0.0022 |

Table 2 shows the real and estimated conductivity and susceptibility values for various regions from the simulation study.

Figure 10:
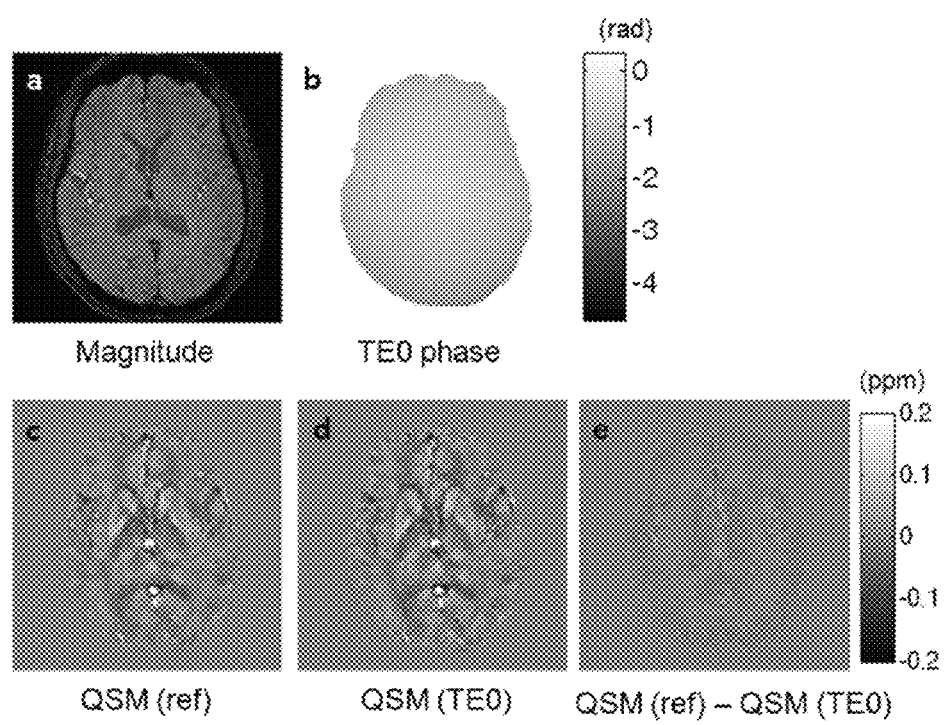
FIG. 10 shows in vivo test results which illustrate the effect of removing the zero echo time phase component from QSM.

FIG. 10 shows in vivo test results which illustrate the effect of removing the zero echo time phase component from QSM.

More specifically, drawing (a) of FIG. 10 represents magnitude, drawing (b) shows the zero TE phase retrieved using the multi-echo gradient echo, drawing (c) shows QSM reconstruction without removing the zero TE phase component, drawing (d) shows QSM reconstruction after removing the zero TE phase component, and drawing (e) shows the difference between the results in drawings (c) and (d).

As shown in drawing (d) of FIG. 10, removal of the TE=0 component can enhance the QSM contrast. The difference image in drawing (e) shows structural features.

Figure 11:
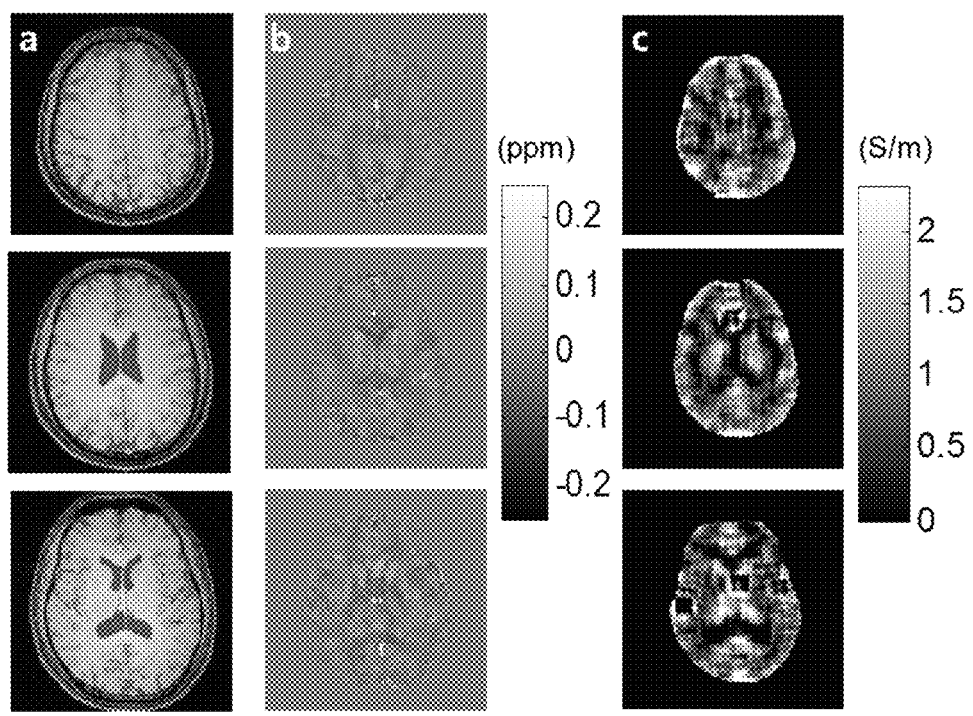
FIG. 11 shows in vivo results for three slices.

FIG. 11 shows in vivo results for three slices, with reconstructed QSM and QCM maps provided for the several slices.

Here, drawing (a) of FIG. 11 shows a magnitude image, drawing (b) shows a reconstructed QSM image with a corresponding range bar in units of ppm, and drawing (c) shows a reconstructed QCM image with a corresponding range bar in units of S/m.

As illustrated in FIG. 11, QSM provides high resolution images and QCM provides relatively accurate quantitative conductivity values.

While QCM still has artificial features, this can be due to the limited SNR of the phase signal which may correspond to a fundamental limitation. More sophisticated reconstruction approaches can enhance the quality of the reconstruction, but there may be a limit to the maximum quality of the QCM map that can be acquired.

According to an embodiment of the invention, as described above, the electrical property of conductivity and the magnetic property of susceptibility for in vivo tissue can be obtained simultaneously by using a 3-dimensional multi-echo gradient echo sequence.

The embodiments of the present invention can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the present invention or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

What is claimed is:

1. A magnetic resonance imaging (MRI) apparatus for conductivity and susceptibility image reconstruction, the MRI apparatus comprising:
    an image acquisition part configured to acquire a multi-echo gradient echo image;
    a susceptibility reconstruction part configured to reconstruct a susceptibility image from the multi-echo gradient echo image based on a phase change of the multi-echo gradient echo image determined according to an increase in time of the multi-echo gradient echo image;
    a zero echo phase estimation part configured to estimate a zero echo phase at zero echo time of the multi-echo gradient echo image based on a linearity of the phase change determined by the susceptibility reconstruction part; and
    a conductivity reconstruction part configured to reconstruct a conductivity image from the multi-echo gradient echo image according to the zero echo phase estimated by the zero echo estimation part.

2. The MRI apparatus of claim 1, further comprising:
a zero echo phase removal part configured to remove the estimated zero echo phase from the multi-echo gradient echo image,
wherein the susceptibility reconstruction part reconstructs the susceptibility image by using the multi-echo gradient echo image with the zero echo phase removed.

3. The MRI apparatus of claim 2, wherein the zero echo phase estimation part estimates the zero echo phase by using a multi-echo gradient echo image obtained by the image acquisition part-during an echo time corresponding to a T2* relaxation time.

4. The MRI apparatus of claim 3, wherein a number of multi-echo gradient echo images obtained during the echo time corresponding to the T2* relaxation time is at least two.

5. The MRI apparatus of claim 2, wherein the multi-echo gradient echo image is obtained from a 3-dimensional multi-echo gradient echo sequence.

6. The MRI apparatus of claim 2, wherein the zero echo phase estimation part estimates the zero echo phase according to a formula shown below:

$$\phi(x, y, z) = -\gamma \Delta B_0 t + \phi_0(x, y, z),$$

where $\phi(x, y, z)$ is a phase at voxel coordinates $(x, y, z)$, $\gamma$ is a gyromagnetic ratio, $\Delta B_0$ is an inhomogeneity of a main field, $t$ is time, and $\phi_0$ is a phase at zero echo time.

7. A method of operating a magnetic resonance imaging (MRI) apparatus for conductivity and susceptibility image reconstruction, the method comprising:
acquiring, by the MRI apparatus, a multi-echo gradient echo image;
reconstructing, by the MRI apparatus, a susceptibility image from the multi-echo gradient echo image based on a phase change of the multi-echo gradient echo image determined according to an increase in time of the multi-echo gradient echo image;
estimating, by the MRI apparatus, a zero echo phase at zero echo time of the multi-echo gradient echo image based on a linearity of the determined phase change; and
reconstructing, by the MRI apparatus, a conductivity image from the multi-echo gradient echo image according to the estimated zero echo phase.

8. The method of claim 7, further comprising:
removing, by the MRI apparatus, the estimated zero echo phase from the multi-echo gradient echo image,
wherein reconstructing the susceptibility comprises reconstructing, by the MRI apparatus, the susceptibility image by using the multi-echo gradient echo image with the zero echo phase removed.

9. The method of claim 8, wherein estimating the zero echo phase comprises estimating, by the MRI apparatus, the zero echo phase by using a multi-echo gradient echo image obtained by the MRI apparatus during an echo time corresponding to a T2* relaxation time.

10. A recorded medium readable by a digital processing device, tangibly embodying a program of instructions executable by the digital processing device to perform a method of operating a magnetic resonance imaging (MRI) apparatus for conductivity and susceptibility image reconstruction, the method comprising:
acquiring, by the MRI apparatus, a multi-echo gradient echo image;
reconstructing, by the MRI apparatus, a susceptibility image from the multi-echo gradient echo image based on a phase change of the multi-echo gradient echo image determined according to an increase in time of the multi-echo gradient echo image;
estimating, by the MRI apparatus, a zero echo phase at zero echo time of the multi-echo gradient echo image based on a linearity of the determined phase change; and
reconstructing, by the MRI apparatus, a conductivity image from the multi-echo gradient echo image according to the estimated zero echo phase.

11. The recorded medium of claim 10, wherein the method further comprises:
removing, by the MRI apparatus, the estimated zero echo phase from the multi-echo gradient echo image,
wherein reconstructing the susceptibility comprises reconstructing, by the MRI apparatus, the susceptibility image by using the multi-echo gradient echo image with the zero echo phase removed.

12. The recorded medium of claim 11, wherein estimating the zero echo phase comprises estimating, by the MRI apparatus, the zero echo phase by using a multi-echo gradient echo image obtained by the MRI apparatus during an echo time corresponding to a T2* relaxation time.

* * * * *